(12) United States Patent
Takada et al.

(10) Patent No.: US 7,619,488 B2
(45) Date of Patent: Nov. 17, 2009

(54) RESISTANCE ADJUSTING CIRCUIT AND SEMICONDUCTOR INTEGRATED CIRCUIT

(75) Inventors: Shuichi Takada, Yokohama (JP); Takeshi Abiru, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 14 days.

(21) Appl. No.: 12/136,228

(22) Filed: Jun. 10, 2008

(65) Prior Publication Data

US 2008/0303605 A1 Dec. 11, 2008

(30) Foreign Application Priority Data

Jun. 11, 2007 (JP) ............................. 2007-154486

(51) Int. Cl.
*H03H 7/38* (2006.01)

(52) U.S. Cl. ..................................................... 333/17.3
(58) Field of Classification Search ................ 333/17.3, 333/32
See application file for complete search history.

(56) References Cited

U.S. PATENT DOCUMENTS

| 6,836,170 B2 | 12/2004 | Kitagawa et al. |
| 6,911,875 B2 | 6/2005 | Lee et al. |
| 7,170,364 B2 | 1/2007 | Lee et al. |

FOREIGN PATENT DOCUMENTS

JP 2001-094048 4/2001

*Primary Examiner*—Stephen E Jones
(74) *Attorney, Agent, or Firm*—Turocy & Watson, LLP

(57) ABSTRACT

A resistance adjusting circuit including a semiconductor integrated circuit includes a reference voltage generating circuit which generates a reference voltage corresponding to a resistance of an external resistor element connected to the semiconductor integrated circuit, a comparison voltage generating circuit which comprises a replica resistor circuit whose resistance is adjusted according to a resistance control signal and generates a comparison voltage corresponding to a resistance of the replica resistor circuit, a main body resistor circuit which has substantially the same configuration as that of the replica resistor circuit and whose resistance is adjusted according to the resistance control signal, and a control signal generating circuit which receives the reference and comparison voltages and converts the voltages to frequency signals corresponding to the voltages, integrates the frequency signals to produce integration data of the frequency signals, and generates the resistance control signal based upon a difference between the integration data.

20 Claims, 10 Drawing Sheets

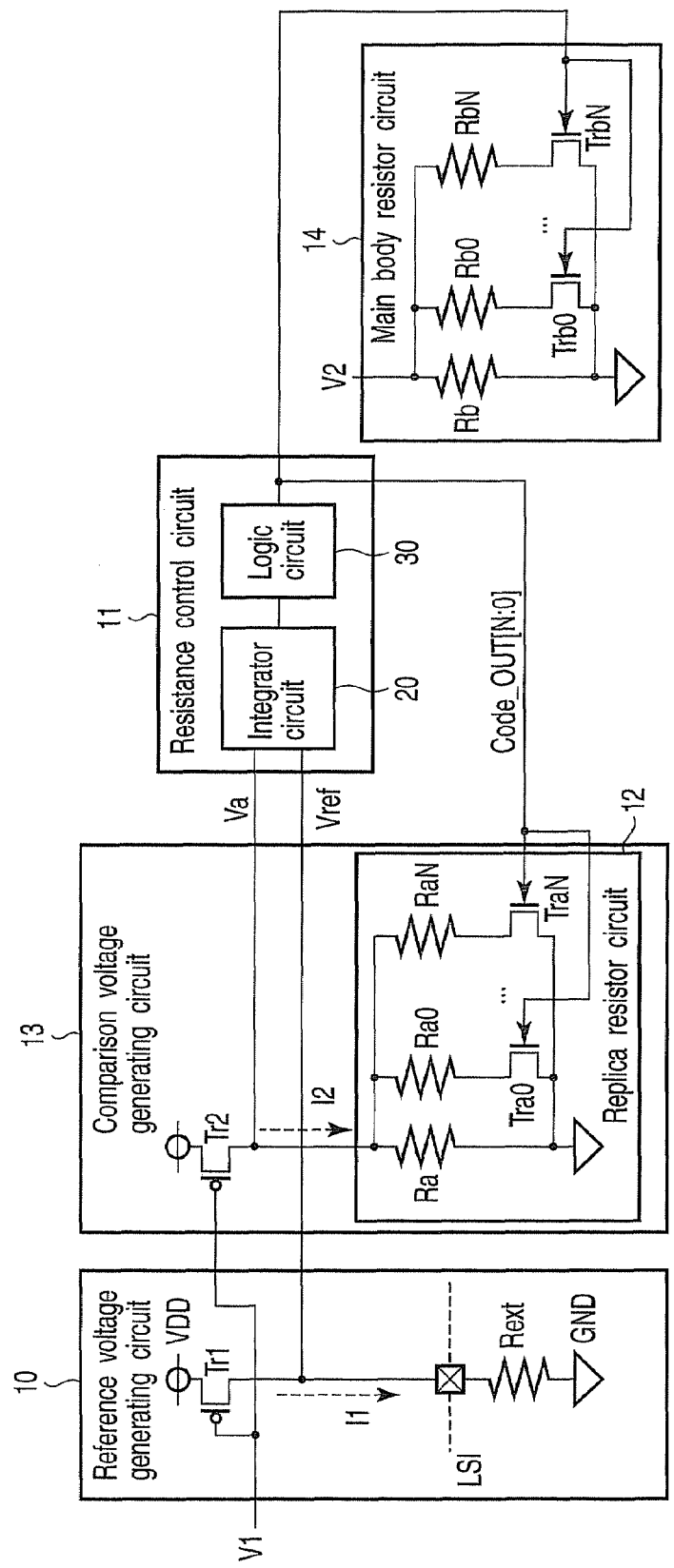
F I G. 2

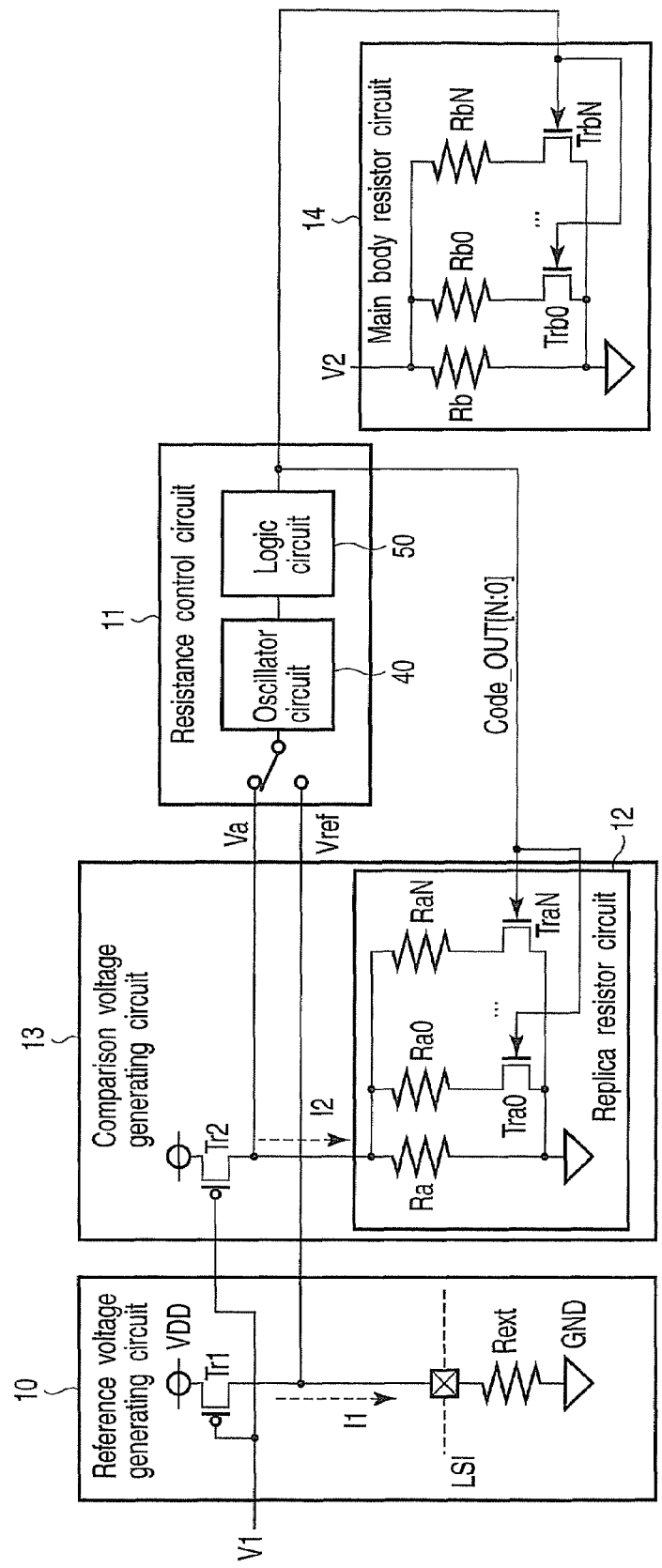
F I G. 5

RESISTANCE ADJUSTING CIRCUIT AND SEMICONDUCTOR INTEGRATED CIRCUIT

CROSS-REFERENCE TO RELATED APPLICATIONS

This application is based upon and claims the benefit of priority from prior Japanese Patent Application No. 2007-154486, filed Jun. 11, 2007, the entire contents of which are incorporated herein by reference.

BACKGROUND OF THE INVENTION

1. Field of the Invention

The present invention relates to a resistance adjusting circuit which performs automatic adjustment such that a resistance of a resistance circuit of a semiconductor integrated circuit is set within a prescribed range based upon an external resistor element, and a semiconductor integrated circuit.

2. Description of the Related Art

A semiconductor integrated circuit for transmission (transmitter LSI) and a semiconductor integrated circuit for reception (receiver LSI) configuring a high-speed signal communication system are connected to each other through a differential transmission line. The receiver LSI comprises a receiver circuit whose differential input terminals are connected to the differential transmission line. Each of the differential input terminals of the receiver circuit is connected with a terminal end resistor. The terminal end resistor is provided in order to make the impedance of the transmission line and the impedance of the input terminal of the receiver circuit to be equal, so that reflection of power or the like caused by impedance mismatching is prevented. Accordingly, it is important to make adjustment such that a resistance of the terminal end resistor is equal to the characteristic impedance of the transmission line. A resistance adjusting circuit is used to adjust the resistance of the terminal end resistor.

Generally, the resistance adjusting circuit is configured to include a reference voltage generating circuit, a resistance control circuit, a comparison voltage generating circuit including a replica resistor circuit, and a main body resistor circuit used as a terminal end resistor. The reference voltage generating circuit generates a reference voltage having a value corresponding to a resistance of an external resistor element which is a reference resistor connected to an external terminal of an LSI. Both the replica resistor circuit and the main body resistor circuit have substantially the same configuration, and resistances thereof are adjusted according to a control code signal outputted from the resistance control circuit. The comparison voltage generating circuit generates a comparison voltage having a value corresponding to a resistance of the replica resistor circuit. The resistance control circuit comprises a voltage comparator and an up/down counter, and compares a reference voltage and a comparison voltage with each other by the voltage comparator and adjusts such that the resistance of the replica resistor circuit and the resistance of the main body resistor circuit is set within a prescribed range, with the result that the resistance of the main body resistor circuit is set within the prescribed range.

A plurality of resistors in each of the replica resistor circuit and the main body resistor circuit is selected according to a control code signal and the selected resistors are connected in parallel so that the combined resistance is adjusted.

When an adjustment pitch of the resistance in the resistance adjusting circuit is set fine in order to increase an accuracy of the resistance of each of the replica resistor circuit and the main body resistor circuit, a difference between the reference voltage and the comparison voltage becomes small. When the difference of the voltages is small, a mismatch voltage of the voltage comparator must be made smaller than the voltage difference by increasing a gain of the voltage comparator in the comparison voltage generating circuit, resulting in that it becomes difficult to design a circuit for the voltage comparator.

Incidentally, Jpn. Pat. Appln. KOKAI Publication No. 2001-94048 discloses a semiconductor device provided with an output impedance control circuit having a function of being capable of adjusting an impedance of an output buffer so as to match an external resistor element.

BRIEF SUMMARY OF THE INVENTION

According to a first aspect of the present invention, there is provided a resistance adjusting circuit including a semiconductor integrated circuit comprising:

a reference voltage generating circuit which generates a reference voltage having a value corresponding to a resistance of an external resistor element connected to the semiconductor integrated circuit;

a comparison voltage generating circuit which comprises a replica resistor circuit whose resistance is adjusted according to a resistance control signal and generates a comparison voltage having a value corresponding to a resistance of the replica resistor circuit;

a main body resistor circuit which has substantially the same configuration as that of the replica resistor circuit and whose resistance is adjusted according to the resistance control signal, and a control signal generating circuit which receives the reference voltage and the comparison voltage and converts the reference voltage and the comparison voltage to frequency signals having frequencies corresponding to values of the reference voltage and the comparison voltage, integrates the frequency signals of the reference voltage and the comparison voltage to produce integration data of the frequency signals, and generates the resistance control signal based upon a difference between the integration data.

According to a second aspect of the present invention, there is provided a resistance adjusting circuit including a semiconductor integrated circuit comprising:

a reference current generating circuit which generates a reference current having a value corresponding to a resistance of an external resistor element connected to the semiconductor integrated circuit;

a comparison current generating circuit which comprises a replica resistor circuit whose resistance is adjusted according to a resistance control signal and generates a comparison current having a value corresponding to a resistance of the replica resistor circuit;

a main body resistor circuit which has substantially the same configuration as that of the replica resistor circuit and whose resistance is adjusted according to the resistance control signal, and a control signal generating circuit which receives the reference current and the comparison current and converts the reference current and the comparison current to frequency signals having frequencies corresponding to values of the reference current and the comparison current, integrates the frequency signals of the reference current and the comparison current to produce integration data of the frequency signals, and generates the resistance control signal based upon a difference between the integration data.

According to a third aspect of the present invention, there is provided a semiconductor integrated circuit comprising:

a signal receiving circuit which has at least one input terminal connected to a transmission line;

a terminal end resistor circuit which is connected to the at least one input terminal of the signal receiving circuit and whose resistance is adjusted according to a control signal;

a reference electricity generating circuit which generates a reference electricity having a value corresponding to a resistance of an external resistor element connected to the semiconductor integrated circuit, the resistance of the external resistor element matching with a characteristic impedance of the transmission line;

a comparison electricity generating circuit which is provided with a replica resistor circuit which has substantially the same configuration as that of the terminal end resistor circuit and whose resistance is adjusted according to the control signal, and which generates a comparison electricity having a value corresponding to the resistance of the replica resistor circuit; and a control signal generating circuit which receives the reference electricity and the comparison electricity and converts the reference electricity and the comparison electricity to frequency signals having frequencies corresponding to values of the reference electricity and the comparison electricity, integrates the frequency signals of the reference electricity and the comparison electricity to produce integration data of the frequency signals, and generates the resistance control signal based upon a difference between the integration data.

BRIEF DESCRIPTION OF THE SEVERAL VIEWS OF THE DRAWING

FIG. 2 is a circuit diagram of a resistance adjusting circuit according to a first embodiment of the present invention, in which the circuits shown in FIG. 1 are shown in detail;

FIG. 5 is a circuit diagram of a resistance adjusting circuit according to a second embodiment of the present invention, in which the circuits shown in FIG. 1 are shown in detail;

DETAILED DESCRIPTION OF THE INVENTION

The present invention will be explained based upon embodiments thereof below with reference to the drawings.

Figure 1:
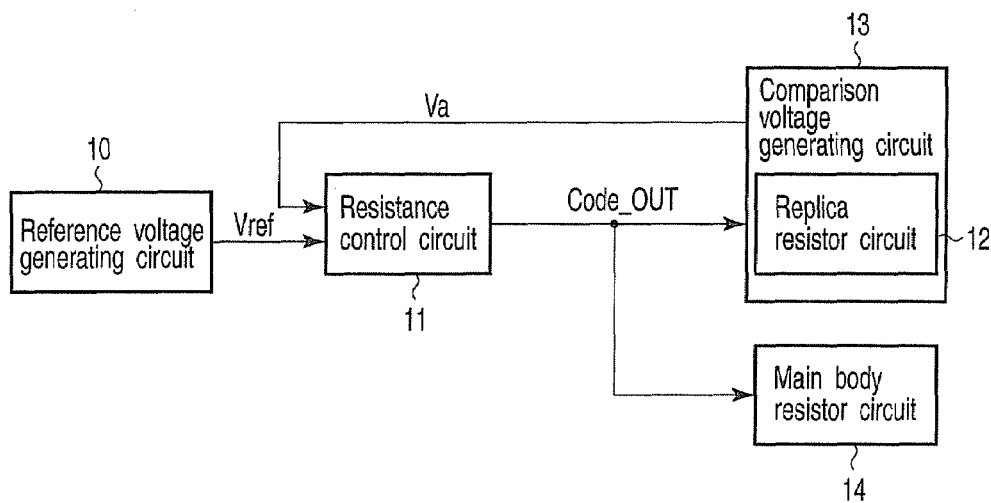
FIG. 1 is a block diagram showing a first basic configuration of resistance adjusting circuits according to embodiments of the present invention.

FIG. 1 is a block diagram showing a first basic configuration of resistance adjusting circuits according to embodiments of the present invention. The resistance adjusting circuit shown in FIG. 1 comprises a reference voltage generating circuit 10, a resistance control circuit 11, a comparison voltage generating circuit 13 including a replica resistor circuit 12, and a main body resistor circuit 14 whose resistance is can be adjusted, these circuits being formed within one LSI (semiconductor integrated circuit). The reference voltage generating circuit 10 generates a reference voltage Vref. The replica resistor circuit 12 and the main body resistor circuit 14 have substantially the same configuration, and resistances thereof are adjusted by a control code signal Code_OUT outputted from the resistance control circuit 11. The comparison voltage generating circuit 13 generates a comparison voltage Va having a value corresponding to a resistance of the replica resistor circuit 12. The resistance control circuit 11 performs adjustment such that a resistance of the replica resistor circuit 12 is set within a prescribed range based upon the reference voltage Vref and the comparison voltage Va, with the result that adjustment can also be performed such that the resistance of the main body resistor circuit 14 is set within a prescribed range.

First Embodiment

FIG. 2 is a circuit diagram of a resistance adjusting circuit according to a first embodiment of the present invention, in which the circuits shown in FIG. 1 are shown in detail. The reference voltage generating circuit 10 comprises a P-channel MOS transistor Tr1 connected to an external resistor element Rext as a reference resistor. The P-channel MOS transistor Tr1 functions as a current source. One end of the external resistor element Rext is connected to an external terminal of the LSI in which the resistance adjusting circuit is formed, and the other end thereof is connected to a node of ground voltage (GND). A source-drain path of the MOS transistor Tr1 is connected between a node of a power source voltage (VDD) and the one end of the external resistor element Rext, i.e., the external terminal of the LSI. In the reference voltage generating circuit 10, when a predetermined bias voltage V1 is supplied to a gate electrode of the MOS transistor Tr1, a constant current I1 flows through the external resistor element Rext so that the reference voltage Vref is generated at the one end of the external resistor element Rext, i.e., the external terminal of the LSI.

The comparison voltage generating circuit 13 comprises the replica resistor circuit 12 and a P-channel MOS transistor Tr2 as a current source for supplying a constant current I2 to the replica resistor circuit 12. A source-drain path of the MOS transistor Tr2 is connected between the node of the power source (VDD) and one end of the replica resistor circuit 12. The other end of the replica resistor circuit 12 is connected to the node of the ground voltage (GND). In the comparison voltage generating circuit 13, when a predetermined bias voltage V1 is applied to a gate electrode of the MOS transistor Tr2, a constant current I2 flows through the replica resistor circuit 12 so that a comparison voltage Va is generated at the one end of the replica resistor circuit 12.

The resistance control circuit 11 comprises a integrator circuit 20 and a logic circuit 30, and outputs a control code signal Code_OUT[N:0] for adjusting resistances of the replica resistor circuit 12 and the main body resistor circuit 14, based upon the reference voltage Vref and the comparison voltage Va.

The replica resistor circuit 12 comprises a plurality of resistors Ra, Ra0, ..., RaN, and N-channel MOS transistors for switches Tra0, ..., TraN. The resistor Ra is connected between the MOS transistor Tr2 and the node of the ground voltage. The respective ones of the resistors Ra0, ..., RaN and the respective ones of the MOS transistors Tra0, ..., TraN are serially connected in a corresponding manner so that series circuits are configured, and the series circuits are connected to the resistor Ra in parallel. Control code signal Code_OUT[N:0] outputted from the resistance control circuit 11 are supplied to the gate electrodes of the MOS transistors for switches Tra0, ..., TraN. Specifically, a signal Code_OUT[0] is supplied to the gate electrode of the MOS transistor Tra0, and a signal Code_OUT[N] is supplied to the gate electrode of the MOS transistor TraN.

The main body resistor circuit 14 has substantially the same configuration as that of the replica resistor circuit 12. That is, the main body resistor circuit 14 has a plurality of resistors Rb, Rb0, ..., RbN and N-channel MOS transistors for switches Trb0, ..., TrbN. The resistor Rb is connected between a node of V2 and the node of the ground voltage. The respective ones of the resistors Rb0, ..., RbN and the respective ones of the MOS transistors Trb0, ..., TrbN are serially connected in a corresponding manner so that series circuits are configured, and the series circuits are connected to the resistor Rb in parallel. Control code signals Code_OUT[N:0] outputted from the resistance control circuit 11 are supplied to the gate electrodes of the MOS transistors for switches Trb0, ..., TrbN. Specifically, a signal Code_OUT[0] is supplied to the gate electrode of the MOS transistor Trb0 and a signal Code_OUT[N] is supplied to the gate electrode of the MOS transistor TrbN.

In the resistance adjusting circuit with a configuration such as shown in FIG. 2, since the same bias voltage V1 is supplied to the gate electrode of the MOS transistor Tr1 of the reference voltage generating circuit 10 and the gate electrode of the MOS transistor Tr2 of the comparison voltage generating circuit 13, a current I1 flowing through the external resistor element Rext and a current I2 flowing through the replica resistor circuit 12 can be made equal by making sizes of both the transistors Tr1 and Tr2 equal to each other.

ON/OFF operations of the MOS transistors for switches Tra0, ..., TraN of the replica resistor circuit 12 are controlled by a control code signal Code_OUT[N:0], so that the resistors Ra0, ..., RaN are selectively connected to the resistor Ra in parallel. As a result, the resistance of the replica resistor circuit 12 can be finely adjusted. Since the resistance of the replica resistor circuit 12 after being adjusted is approximately equal to the resistance of the external resistor element Rext which is the reference resistor, the value of N and respective resistances of Ra and Ra0 to RaN are set such that a combined resistance thereof is to be a value equal to or near the resistance of the external resistor element Rext. For example, it is assumed that Ra0 to Ra2 are set so as to satisfy the following Equations (1) to (3) based upon Ra3 under the condition of, for example, N=3, Ra=85Ω, and Ra3=100Ω. The resistors of the main body resistor circuit 14 are set so that the resistances of the resistors of the main body resistor circuit 14 have substantially the same resistances as those of the resistors of the replica resistor circuit 12, or the resistance ratio of the resistors of the main body resistor circuit 14 has substantially the same resistance ratio as that of the resistors of the replica resistor circuit 12.

$$Ra0=(2^3) \times Ra3=800\Omega \quad (1)$$

$$Ra1=(2^2) \times Ra3=400\Omega \quad (2)$$

$$Ra2=(2^1) \times Ra3=200\Omega \quad (3)$$

Figure 3:
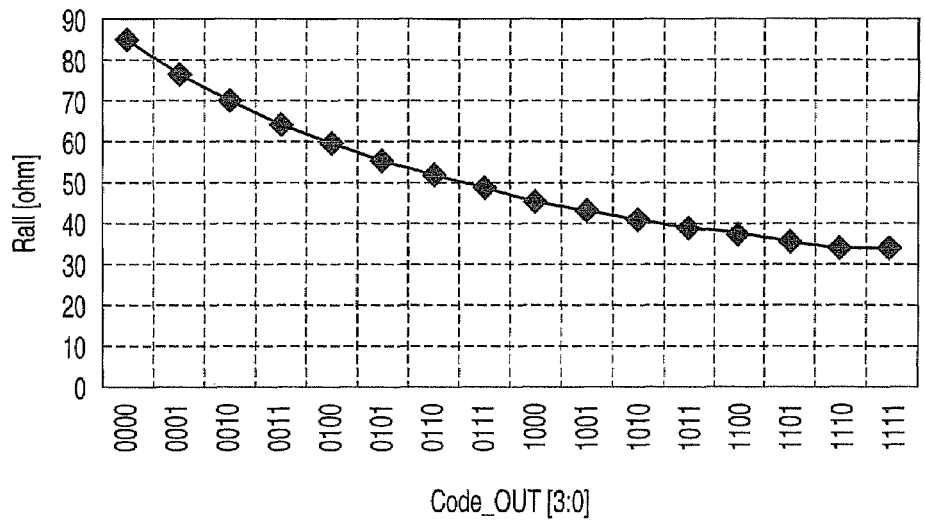
FIG. 3 is a characteristic diagram showing a relationship between a control code signal and a combined resistance in the replica resistor circuit of the resistance adjusting circuit according to the first embodiment of the present invention.

In this case, a relationship between the control code signal Code_OUT[3:0] and the combined resistance Rall in the replica resistor circuit 12 is represented as shown in the following Table 1. A characteristic curve of the relationship is shown in FIG. 3.

TABLE 1

| Code_OUT[3:0] | Rall[ohm] |
|---|---|
| 0000 | 85.0 |
| 0001 | 76.8 |
| 0010 | 70.1 |
| 0011 | 64.5 |
| 0100 | 59.6 |
| 0101 | 55.5 |
| 0110 | 51.9 |
| 0111 | 48.7 |
| 1000 | 45.9 |
| 1001 | 43.5 |
| 1010 | 41.2 |
| 1011 | 39.2 |
| 1100 | 37.4 |
| 1101 | 35.7 |
| 1110 | 34.2 |
| 1111 | 32.8 |

For example, when the control code signal Code_OUT[3:0]=0000, all the MOS transistors Tra0, ..., TraN(N=3) of the replica resistor circuit 12 are turned OFF, so that the combined resistance Rall is expressed by the following Equation (4).

$$Rall=1/(1/Ra)=Ra=85\Omega \quad (4)$$

Further, when the control code signal Code_OUT[3:0]=1111, all the MOS transistors Tra0, ..., TraN(N=3) of the replica resistor circuit 12 are turned ON. In this case, since all of Ra, and Ra0 to Ra3 are connected in parallel, the combined resistance Rall is expressed by the following Equation (5).

$$Rall=1/(1/Ra+1/Ra0+1/Ra1+1/Ra2+1/Ra3)=32.8\Omega \quad (5)$$

When the control code signal Code_OUT and the combined resistance Ra11 satisfy such a relationship as described above, the number of resistances which the replica resistor circuit 12 can have becomes equal to the number of combinations of Code_OUT[3:0]. That is, in this case, the number of resistances which the replica resistor circuit 12 can have reaches $2^{(3+1)}=16$. When the number of combinations reaches a large number, an adjustable range becomes large according to increase of differences among resistances, namely, increase of the adjustment pitch for the resistance, under the condition of each combination. Therefore, even if a fluctuation range of the resistance of the replica resistor circuit 12 is large due to fluctuation of a temperature, a voltage, a manufacturing factor, or the like, the resistance of the replica resistor circuit 12 can be adjusted to set within a prescribed range. When the adjustment pitch for the resistance under the condition of each combination is made smaller, adjustment accuracy becomes high so that adjustment of the resistance of the replica resistor circuit 12 is made possible even when a prescribed resistance range is small.

Thus, the resistance of the replica resistor circuit 12 is adjusted such that it becomes approximately equal to the value of the external resistor element Rext which is the reference resistor. Since the main body resistor circuit 14 has substantially the same configuration as that of the replica resistor circuit 12 and it is controlled based upon a control code signal Code_OUT[N:0] outputted from the resistance control circuit 11 like the replica resistor circuit 12, the resistance of the main resistance circuit 14 is adjusted in an aspect similar to that of the resistance of the replica resistor circuit 12. For example, if resistances of resistors of the replica resistor circuit 12 and the main body resistor circuit 14 corresponding to each other are set to be equal to each other, the resistance of the main body resistor circuit 14 is adjusted to be approximately equal to the resistance of the external resistor element Rext which is the reference resistor. In the replica resistor circuit 12 and the main body resistor circuit 14, when a resistance ratio of resistors corresponding to each other is set to P (a positive natural number), the resistance of the main body resistor circuit 14 is adjusted to have a resistance approximately P times the resistance of the external resistor element Rext.

Figure 4:
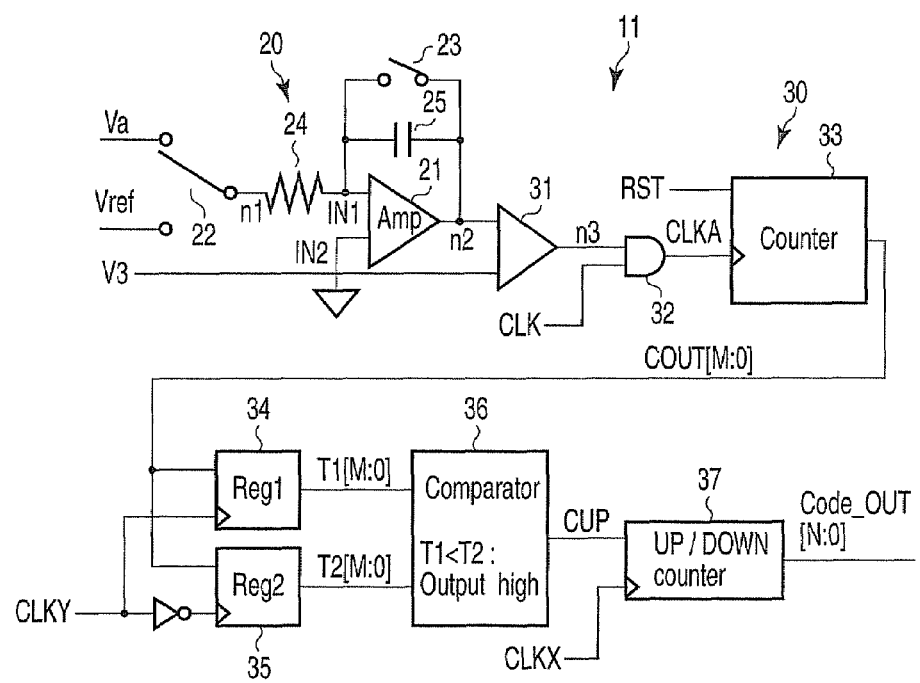
FIG. 4 is a circuit diagram showing one example of a specific configuration of an integrator circuit and a logic circuit configuring the resistance control circuit of the resistance adjusting circuit according to the first embodiment of the present invention.

FIG. 4 shows one example of a specific circuit configuration of the integrator circuit 20 and the logic circuit 30 configuring the resistance control circuit 11 in FIG. 2.

The integrator circuit 20 integrates the reference voltage Vref and the comparison voltage Va0, respectively, and it comprises a differential amplifier (Amp) 21, switches 22 and 23, a resistor 24, a capacitor 25, etc. The differential amplifier 21 has first and second input nodes IN1 and IN2, where one of the reference voltage Vref and the comparison voltage Va selected by the switch 22 is supplied to the first input node IN1 via the resistor 24. The second input node IN2 is connected to a node of the ground voltage. The capacitor 25 and the switch 23 are connected in parallel between the first input node IN1 and an output node of the differential amplifier 21.

The logic circuit 30 measures a period of time taken until an output voltage of the integrator circuit 20 reaches an arbitrary threshold voltage V3 and outputs a control code signal Code_OUT[N:0] based upon the measurement result, and it comprises a voltage comparator 31, an AND gate 32, a counter 33, registers (Reg1, Reg2) 34 and 35, a comparator 36, an up/down counter 37, etc. The voltage comparator 31 compares an output voltage of the integrator circuit 20 and the threshold voltage V3 with each other and outputs a logic signal. The AND gate 32 is supplied with an output signal of the integrator circuit 20 and a clock signal CLK and it outputs an output clock signal CLKA while the output signal of the integrator circuit 20 is high. The output signal CLKA of the AND gate 32 is supplied to the counter 33. The counter 33 counts the outputs CLKA from the AND gate 32. The counter 33 is reset at an arbitrary timing by a reset signal RST. Count data COUT[M:0] of the counter 33 is supplied to the registers 34 and 35. In synchronism with a timing signal CLKY, count data COUT[M:0] during selection of the comparison voltage Va performed by the switch 22 is stored in the register 34, and count data COUT[M:0] during selection of the reference voltage Vref performed by the switch 22 is stored in the register 35. Data T1[M:0] and T2[M:0] in the registers 34 and 35 are compared by the comparator 36 to determine which is larger or smaller than the other, and the comparison result CUP is supplied to the up/down counter 37. For example, when the data T1[M:0] is larger than the data T2[M:0] (T1[M:0]>T2[M:0]), the comparison result CUP of the comparator 36 goes high. The up/down counter 37 conducts up-counting or down-counting based upon the comparison result CUP of the comparator 36 in synchronism with a timing signal CLKX and outputs a control code signal Code_OUT[N:0].

Next, an operation of the resistance control circuit 11 shown in FIG. 4 will be explained below. In the integrator circuit 20, the switch 23 is first turned ON for an integrating operation of the reference voltage Vref or the comparison voltage Va, and an input and an output voltage of the differential amplifier 21 are set to the same voltage by short-circuiting the input and the output terminal of the differential amplifier 21, so that a canceling operation to input offset of the differential amplifier 21 is performed. Simultaneously therewith, the counter 33 is reset.

When the comparison voltage Va is selected by the switch 22, integration of the comparison voltage Va is performed. An output voltage of the differential amplifier 21 is sequentially increased according to integration of the comparison voltage Va performed by the integrator circuit 20, and when the output voltage exceeds the threshold voltage V3, the output signal of the voltage comparator 31 changes from high to low. On the other hand, the counter 33 counts the clock signals CLK while the output signal of the voltage comparator 31 is high, namely, during output of clock signals CLK from the AND gate 32. Count data COUT[M:0] of the counter 33 is stored in the register 34 at such a timing that the timing signal CLKY goes high.

On the other hand, when the reference voltage Vref is selected by the switch 22, integration of the reference voltage Vref is performed. An output voltage of the differential amplifier 21 is sequentially increased according to integration of the reference voltage Vref performed by the integrator circuit 20, and when the output voltage exceeds the threshold voltage V3, the output signal of the voltage comparator 31 changes from high to low. On the other hand, the counter 33 counts the clock signals CLK while the output signal of the voltage comparator 31 is high, namely, during output of clock signals CLK from the AND gate 32. Count data COUT[M:0] of the counter 33 is stored in the register 35 at such a timing that the timing signal CLKY goes low.

Thereafter, data T1[M:0] and data T2[M:0] of the registers 34 and 35 are compared by the comparator 36 to determine which is larger or smaller than the other. Up-counting or down-counting is performed by the up/down counter 37 based upon the comparison result CUP in synchronism with the timing signal CLKX, so that a control code signal Code_OUT[N:0] is set.

For example, when T1[M:0] is smaller than T2[M:0], the comparison voltage Va is larger than the reference voltage Vref, and respective resistances of the replica resistor circuit 12 and the main body resistor circuit 14 are larger than a value of the external resistor element Rext. In this case, the comparison result CUP of the comparator 36 goes high and the up/down counter 37 performs up-counting in synchronism with the timing signal CLKX so that the control code signal Code_OUT[N:0] is set such that respective resistances of the replica resistor circuit 12 and the main body resistor circuit 14 are adjusted to be smaller than their previous values.

On the contrary, when T1[M:0] is larger than T2[M:0], the comparison voltage Va is smaller than the reference voltage Vref. In this case, the comparison result CUP of the comparator 36 goes low and the up/down counter 37 performs down-counting in synchronism with the timing signal CLKX so that the control code signal Code_OUT[N:0] is set such that respective resistances of the replica resistor circuit 12 and the main body resistor circuit 14 are adjusted to be larger than their previous values.

When a difference between T1[M:0] and T2[M:0] becomes sufficiently small, the respective resistances of the replica resistor circuit 12 and the main body resistor circuit 14 are set within the prescribed ranges.

In the resistance adjusting circuit according to the first embodiment, when the adjustment pitch for the resistance is set to be fine in order to increase accuracy when the resistances of the replica resistor circuit 12 and the main body resistor circuit 14 are adjusted, a difference between the reference voltage Vref and the comparison voltage Va is reduced so that the data T1[M:0] and the data T2[M:0] to be stored in the registers 34 and 35 also becomes small. However, when the difference between the data T1[M:0] and the data T2[M:0] cannot be compared by the comparator 36 due to that the difference therebetween is excessively small, the value of the capacitor 25 in the integrator circuit 20 can be increased. Length of time required until the output voltage of the integrator circuit 20 exceeds the threshold voltage V3 of the voltage comparator 31 becomes long, and the difference between the data T1[M:0] and the data T2[M:0] becomes sufficiently large so that the difference can be easily detected by the comparator 36.

Thus, in the resistance adjusting circuit according to the first embodiment, the resistance of the main body resistor circuit 14 can be adjusted with a high degree of accuracy. In addition, since the voltage comparator 31 within the resistance control circuit 11 does not perform comparison of each of the reference voltage Vref and the comparison voltage Va themselves but performs comparison of a voltage obtained by integrating each of the reference voltage Vref and the comparison voltage Va with the threshold voltage in the integrator circuit 20, a comparator whose gain is so large is not required as the voltage comparator 31. Accordingly, circuit design for the resistance adjusting circuit can be made easy.

Second Embodiment

FIG. 5 is a circuit diagram of a resistance adjusting circuit according to a second embodiment of the present invention, in which the circuits shown in FIG. 1 are shown in detail. The resistance adjusting circuit according to the second embodiment comprises a reference voltage generating circuit 10, a comparison voltage generating circuit 13 including a replica resistor circuit 12, and a main body resistor circuit 14 whose resistance is a target to be adjusted. These circuits have configurations similar to those shown in FIG. 2, and explanation thereof will be omitted herein.

A resistance control circuit 11 in this embodiment is different from that shown in FIG. 2, and it comprises an oscillator circuit 40 and a logic circuit 50. The resistance control circuit 11 in this embodiment converts a reference voltage Vref and a comparison voltage Va to signals having frequencies corresponding to their voltage values, integrates both the signals to produce integration data of the signals, and outputs a control code signal Code_OUT[N:0] based upon a difference between both the integration data.

Figure 6:
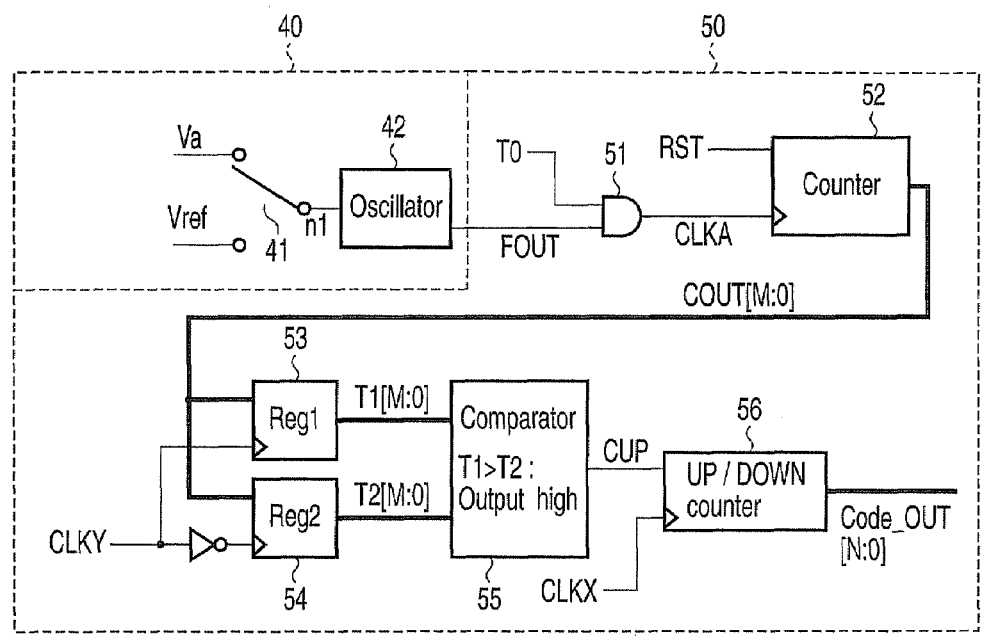
FIG. 6 is a circuit diagram showing one example of a specific configuration of an oscillator circuit and a logic circuit configuring a resistance control circuit of the resistance adjusting circuit of a second embodiment of the present invention.

FIG. 6 shows one example of a specific circuit configuration of the oscillator circuit 40 and the logic circuit 50 configuring the resistance control circuit 11 shown in FIG. 5. The oscillator circuit 40 comprises a switch 41 and a voltage-controlled oscillator 42. The switch 41 selects either one of a reference voltage Vref and a comparison voltage Va to supply the selected one to an input node n1 of the voltage-controlled oscillator 42. The voltage-controlled oscillator 42 generates an oscillation output with a frequency proportional to an input voltage. A signal of the oscillation output from the voltage-controlled oscillator 42 is supplied to the logic circuit 50.

The logic circuit 50 comprises an AND gate 51, a counter 52, registers (Reg1, Reg1) 53 and 54, a comparator 55, an up/down counter 56, and so on. The logic circuit 50 detects a difference between an output oscillation frequency of the voltage-controlled oscillator 42 during input of the reference voltage Vref to the oscillator 42 and an output oscillation frequency of the voltage-controlled oscillator 42 during input of the comparison voltage Va to the oscillator 42 to output a control code signal Code_OUT[N:0] based upon the detection result.

The AND gate 51 is supplied with an oscillation output signal FOUT of the voltage-controlled oscillator 42 and a timer signal T0 which is high for an arbitrary period and it outputs the oscillation output signal FOUR while the timer signal T0 is high. An output signal CLKA of the AND gate 51 is supplied to the counter 52. The counter 52 counts output signals CLKA of the AND gate 51. The counter 52 is reset at an arbitrary timing by a reset signal RST. Count data COUT[M:0] of the counter 52 is supplied to the registers 53 and 54. Data COUT[M:0] counted by the counter 52 during a period of time of selection of the comparison voltage Va performed by the switch 41 is stored in the register 53 in synchronism with a timing signal CLKY, while data COUT[M:0] counted by the counter 52 during a period of time of selection of the reference voltage Vref performed by the switch 41 is stored in register 54 in synchronism with a timing signal CLKY. Data T1[M:0] and data T2[M:0] of the registers 53 and 54 are compared by the comparator 55 to determine which is larger or smaller than the other, and the comparison result CUP is supplied to the up/down counter 56. For example, when the data T1[M:0] is larger than the data T2[M:0] (T1[M:0]>T2[M:0]), the comparison result CUP of the comparator 55 goes high. The up/down counter 56 performs up-counting or down-counting based upon the comparison result CUP of the comparator 55 in synchronism with a timing signal CLKX to output a control code signal Code_OUT[N:0].

That is, the resistance control circuit 11 comprises a voltage-controlled oscillator 42 which is inputted with one of the reference voltage Vref and the comparison voltage Va through the switch 41 in a switching manner to generate an oscillation output with a frequency proportional to a value of an input voltage, a counter 52 which counts oscillation outputs of the voltage-controlled oscillator 42 during a period of time of input of the reference voltage Vref to the oscillator 42 and oscillation outputs of the voltage-controlled oscillator 42 during a period of time of input of the comparison voltage Va to the oscillator 42 for the same period of time (T0) to obtain a first and a second count data (T1, T2), a comparator 55 which compares the first count data and the second count data with each other to determine which is larger or smaller than the other, and an up/down counter 56 which serves as a control signal setting circuit for setting a control signal based upon the comparison result of the comparator 55.

Figure 7:
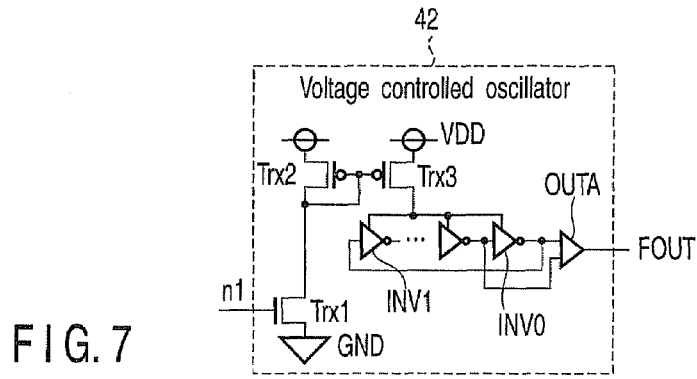
FIG. 7 is a circuit diagram showing one example of a specific configuration of a voltage-controlled oscillator constituting the oscillator circuit shown in FIG. 6.

FIG. 7 shows one example of a specific circuit configuration of the voltage-controlled oscillator 42 shown in FIG. 6. The voltage-controlled oscillator 42 may be a well-known one, and comprises an N-channel MOS transistor Trx1 whose gate electrode is inputted with one of the comparison voltage Va and the reference voltage Vref selected by the switch 41 and which causes a drain current corresponding to the voltage inputted to the gate electrode to flow, a current mirror circuit which comprises two P-channel MOS transistors Trx2, Trx3 generating a current proportional to the drain current of the MOS transistor Trx1, a plurality of inverters INV1 to INV0 which are connected in series such that an output signal of a final stage is fed back as an input signal to a forefront stage and whose power source nodes are supplied with an output current from the current mirror circuit, and a differential amplifying circuit OUTA which is supplied with an input signal and an output signal of one of the plurality of inverters INV1 to INV0, namely, that of the final stage inverter INV0 in this example, to generate an oscillation output signal FOUT.

The voltage-controlled oscillator 42 with such a configuration generates an oscillation output signal FOUT with a frequency proportional to a voltage value of the comparison voltage Va or the reference voltage Vref which is an input voltage.

Figure 8:
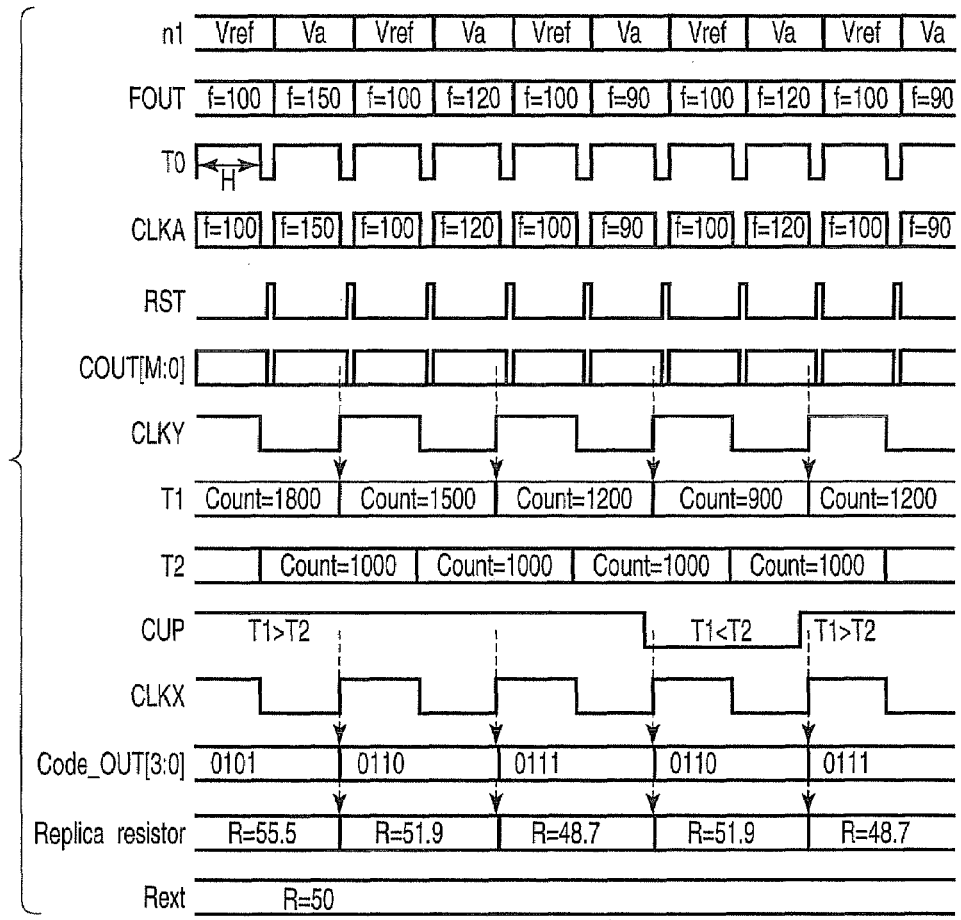
FIG. 8 is a timing chart showing an operation of the resistance control circuit according to the second embodiment of the present invention.

Next, an operation of the resistance adjusting circuit with such a configuration as described above according to the second embodiment will be explained using a timing chart shown in FIG. 8. It is assumed that N=3, Ra=85Ω, Ra3=100Ω, Ra2=200Ω, Ra1=400Ω, and Ra0=800Ω are set in the replica resistor circuit 12. It is assumed that the resistance of the external resistor element Rext is set to 50Ω. Further, it is assumed that the control code signal Code_OUT [3:0] is preliminarily set to 0101, and the respective resistances of the replica resistor circuit 12 and the main body resistor circuit 14 are set to 55.5Ω (R=55.5).

First, the Reference Voltage Vref is Selected by the switch 41 and the reference voltage Vref is supplied to an input node n1 of the voltage-controlled oscillator 42. The voltage-controlled oscillator 42 generates an oscillation output FOUT with a frequency proportional to the reference voltage Vref. It is assumed that the frequency of the oscillation output signal FOUT in this case is set to 100 MHz (f=100). A reset signal RST which resets the counter 52 goes high a little before the timer signal T0 goes high, so that the counter 52 is preliminarily reset. As the timer signal T0 goes high, the reset signal RST goes low, so that the reset operation of the counter 52 is released. The output signals CLKA of the AND gate 51 are counted by the counter 52 during a period of time H where the timer signal T0 is high. The count data COUT[M:0] of the counter 52 is stored in the register 54 in synchronism with a timing at which the timing signal CLKY goes high. It is assumed that the count data T2[M:0] stored in the register 54 is 1000.

Next, the comparison voltage Va is selected by the switch 41, and the comparison voltage Va is supplied to the input node n1 of the voltage-controlled oscillator 42. The voltage-controlled oscillator 42 generates an oscillation output FOUT with a frequency proportional to the comparison voltage Va. It is assumed that the frequency of the oscillation output signal FOUT in this case is 150 MHz (f=150). The reset signal RST which resets the counter 52 goes high a little before the timer signal T0 goes high, so that the counter 52 is preliminarily reset. As the timer signal T0 goes high, the reset signal RST goes low, so that the reset operation of the counter 52 is released. The output signals CLKA of the AND gate 51 are counted by the counter 52 during a period of time H where the timer signal T0 is high. The count data COUT[M:0] of the counter 52 is stored in the register 53 in synchronism with a timing at which the timing signal CLKY goes low. It is assumed that the count data T1[M:0] stored in the register 53 is 1500.

Thereafter, the data T1[M:1], the data T2[M:0] of the registers 53 and 54 are compared by the comparator 55 to determine which is larger or smaller than the other. In this case, the T1[M:0] is larger than the T2[M:0], and thus the comparison result CUP obtained by the comparator 55 goes high. When the up/down counter 56 receives the comparison result CUP, a code-up operation of the control code signal Code_OUT[3:0] is performed by the up/down counter 56 in synchronism with a timing at which the timing signal CLKX goes high. Since an original value of the control code signal Code_OUT [3:0] is 0101, 0110 is obtained according to the code-up of the control code signal Code_OUT[3:0]. The resistance of the replica resistor circuit 12 is changed according to the control code signal Code_OUT[3:0], so that the resistance becomes 51.9Ω which is lower than 55.5Ω which is the original value by one code. By repeating similar operations, the control code signal Code_OUT[3:0] outputted from the up/down counter 56 repeats two codes of 0110 and 0111, so that the resistance of the replica resistor circuit 12 is adjusted to a value close to the value of the external resistor element Rext. Similarly, the resistance of the main body resistor circuit 14 is also adjusted to a value close to the value of the external resistor element Rext.

An operation configuring a feature of the circuit according to this embodiment is performed by the voltage-controlled oscillator 42 and the counter 52. The counter 52 functions as an integrator circuit integrating the oscillation output signal FOUT of the voltage-controlled oscillator 42. Since the input clock signals CLKA corresponding to one cycle are required for the counter 52 to conduct one count, the following is obtained.

$$1 \text{ count} = 360° \tag{6}$$

The count value of the counter 52 can be expressed by a phase. A relationship between a phase Φ and an angular velocity ω is expressed by the following Equation (7)

$$\omega = d\Phi/dt \tag{7}$$

The angular velocity ω is expressed by a frequency like the following Equation (8)

$$\omega = 2\pi f \tag{8}$$

Therefore, according to Equations (7) and (8), $$d\Phi/dt = 2\pi f \tag{9}$$

$$\Phi = \int 2\pi f \, dt \tag{10}$$

are obtained, so that it is understood from Equation (10) that the phase is integration of the frequency. As shown in Equation (6), since the phase can be expressed by the count value, it is understood that counting the frequency of the oscillation output signal FOUT of the voltage-controlled oscillator 42 is integration of the frequency performed by the counter 52. A relationship between input and output in a case of a conventional integrator circuit utilizing a resistance R and a capacitor C is expressed by the following Equation.

$$Vo = \int Vi \, dt \tag{11}$$

From comparison between Equation (11) in case of the conventional integrator circuit and Equation (10) in case of the circuit of the embodiment, it is understood that although the input voltage Vi in Equation (11) corresponds to the frequency f in Equation (10) and the output voltage Vo in Equation (11) corresponds to the phase Φ, the both circuits have an integration function, so that it is possible to detect a fine frequency difference as a difference in count value by integrating the fine frequency difference.

Figure 9:
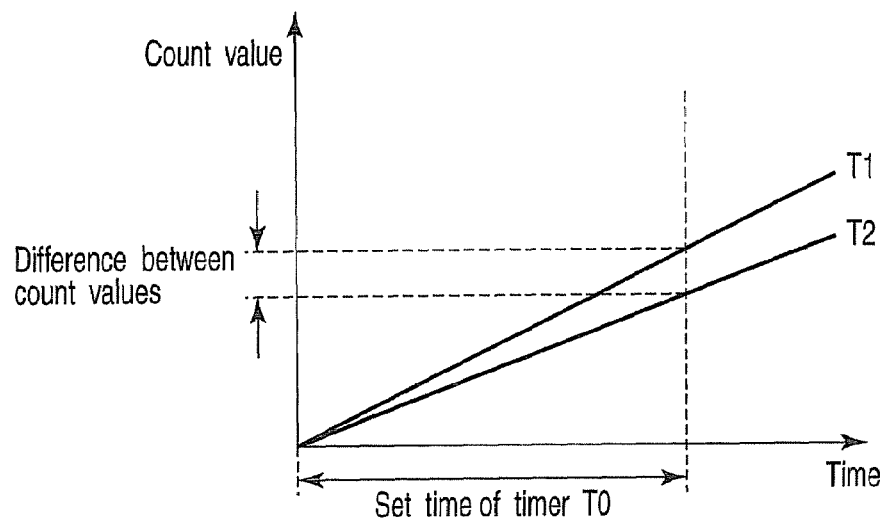
FIG. 9 is a characteristic diagram showing a relationship between an integration time and a count value of a counter in the resistance adjusting circuit according to the second embodiment of the present invention.

FIG. 9 shows a relationship between time (T0) set by the timer, i.e., integration time of the counter 52, and count values (T1, T2).

In the embodiment, the resistance of the main body resistor circuit 14 can be adjusted with a high accuracy like the first embodiment.

Figure 10:
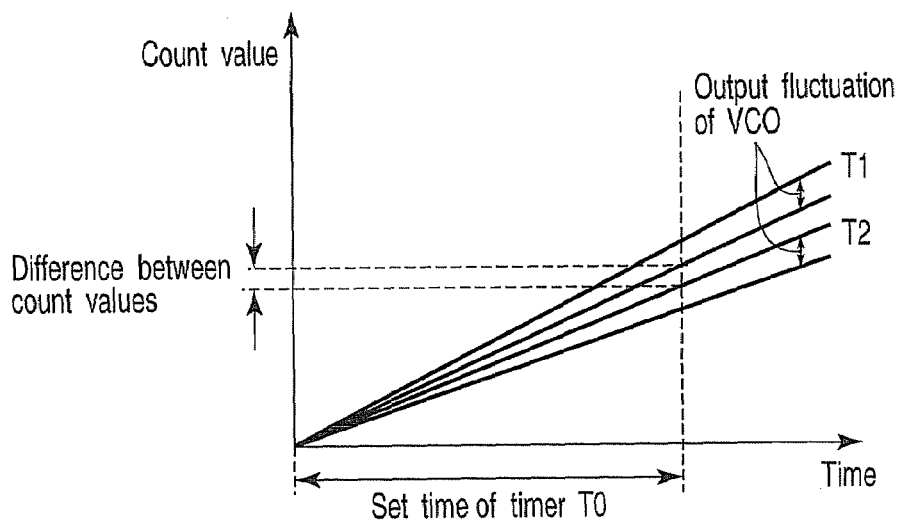
FIG. 10 is a characteristic diagram showing a relationship between an integration time and a count value of the counter when an output of a voltage-controlled oscillator in the resistance adjusting circuit according to the second embodiment of the present invention is unstable.

In the embodiment, since the oscillation frequency is counted and integration is performed, even if the output from the voltage-controlled oscillator 42 is unstable, any specific problem does not occur regarding adjustment of the resistance of the main resistance circuit 14 performed with a high accuracy if the count period (T0) in the counter 52 is long so that a difference in count value between T1 and T2 can be detected as shown in FIG. 10.

In the embodiment, when a difference between the comparison voltage Va and the reference voltage Vref is small so that a difference between the data T1[M:0] and the data T2[M:0] cannot be detected, the difference between the data T1[M:0] and the data T2[M:0] can be detected by increasing the gain of the voltage-controlled oscillator 42 or a setting time of the timer signal T0.

Incidentally, in the circuit of the first embodiment, since the integration time of the integrator circuit is increased, it is necessary to use an element having a large capacity as the capacitor. However, when the capacitor having a large capacity is used, a chip area is increased. Since a differential amplifier comprising an operational amplifier is used, the number of analog circuits increases, which results in increase of factors causing fluctuation in circuits.

On the other hand, in the embodiment, since such a configuration is adopted that the oscillator is used and integration of the oscillation output signal is performed, such a problem that a large area is occupied by the capacitor like the integrator circuit using the capacitor like the first embodiment does not arises, so that such an effect can be attained that a chip area can be reduced. When the gain of the oscillator is small or when the oscillation output is unstable, such means for prolonging the setting time of the timer signal T0 can be taken. That is, even if the characteristic impedance of the oscillator circuit 40 which is an analog circuit is low, such a problem can be overcome in the logic circuit 50, so that circuit design is made easy.

Third Embodiment

Figure 11:
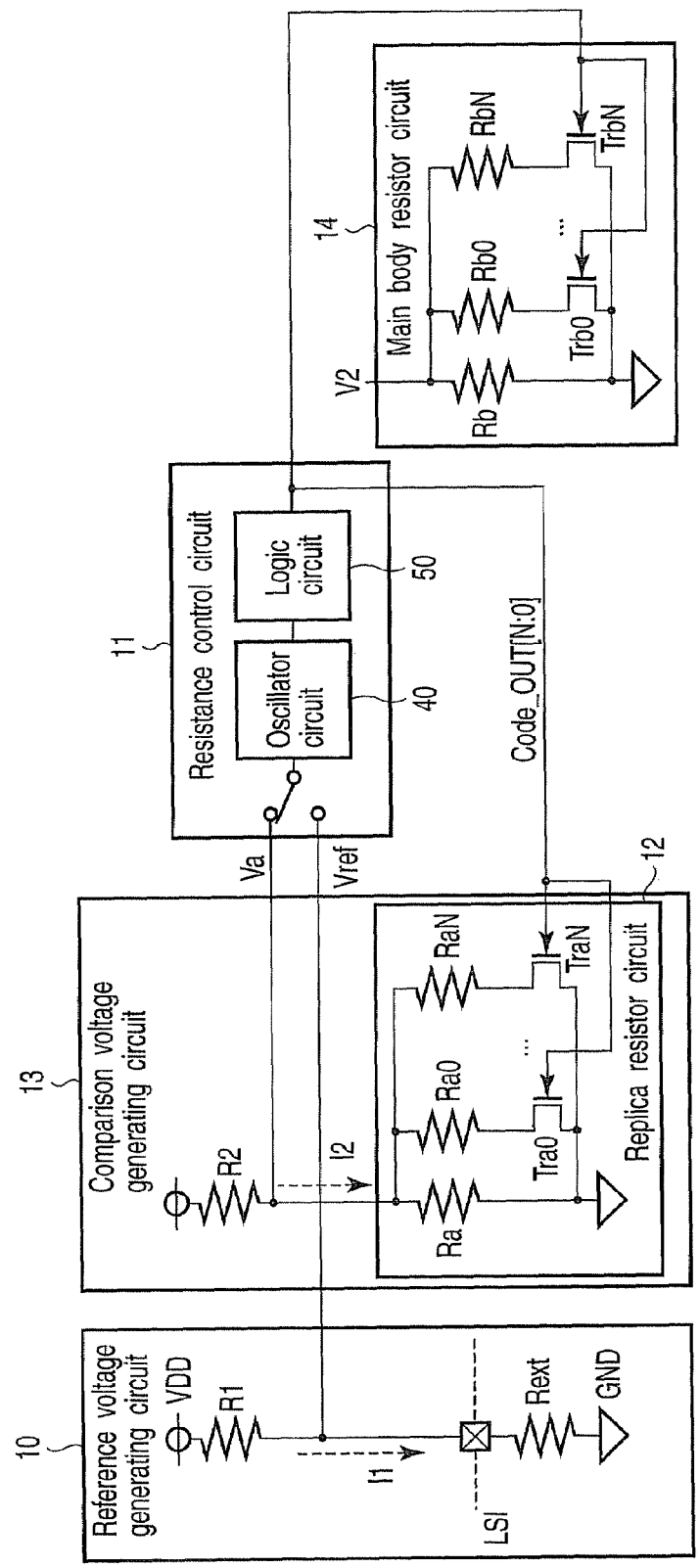
FIG. 11 is a circuit diagram of a resistance adjusting circuit according to a third embodiment of the present invention, in which the circuits shown in FIG. 1 are shown in detail.

FIG. 11 is a circuit diagram of a resistance adjusting circuit according to a third embodiment of the present invention, in which the circuits shown in FIG. 1 are shown in detail. A difference between the resistance adjusting circuit according to the third embodiment and the resistance adjusting circuit according to the second embodiment shown in FIG. 5 lies in such a point that a resistor R1 is provided instead of the P-channel MOS transistor Tr1 for a current source of the reference voltage generating circuit 10 in this embodiment and such a point that a resistor R2 is provided instead of the P-channel MOS transistor Tr2 for a current source of the comparison voltage generating circuit 13 in this embodiment. The other configuration of the resistance adjusting circuit according to the present embodiment is similar to that of the resistance adjusting circuit according the second embodiment.

That is, the reference voltage generating circuit 10 comprises an external resistor element Rext which is a reference resistor and a resistor R1. One end of the external resistor element Rext is connected to an external terminal of an LSI on which the resistance adjusting circuit is formed and the other end thereof is connected to a node of a ground voltage (GND). The resistor R1 is connected between a node of a power source voltage (VDD) and the one end of the external resistor element Rext, i.e., the external terminal of the LSI. In the reference voltage generating circuit 10, a value of the reference voltage Vref is determined depending on a ratio of the resistors R1 and Rext, while a current I1 flowing through the external resistor element Rext is determined depending on a combined resistance (a series resistances) of the resistors R1 and Rext.

The comparison voltage generating circuit 13 comprises a replica resistor circuit 12 and the resistor R2. The resistor R2 is connected between a node of the power source voltage and one end of the replica resistor circuit 12.

Here, the resistors R1 and Rext within the reference voltage generating circuit 10 and the resistor R2 and the replica resistor circuit 12 within the comparison voltage generating circuit 13 configure a bridge circuit. A resistance of the resistor R2 and that of respective resistors within the replica resistor circuit 12 are set such that a resistance ratio of the resistor R2 and the replica resistor circuit 12 after a resistance thereof is adjusted becomes equal to a resistance ratio of the resistors R1 and Rext, so that the comparison voltage Va and the reference voltage Va become equal to each other after the resistance of the replica resistor circuit 12 is adjusted.

In the resistance adjusting circuit according to the embodiment, an effect similar to the second embodiment can be obtained. In the embodiment, since the resistors R1 and R2 are used in the reference voltage generating circuit 10 and the comparison voltage generating circuit 13, the resistance ratio of the resistors R1 and Rext can be made equal to the resistance ratio of the resistor R2 and the replica resistor circuit 12 after adjusted. That is, assuming that the resistance of the replica resistor circuit 12 after adjusted is R3, the resistance of the resistor R2 and the resistances of respective resistors within the replica resistor circuit 12 can be set so as to satisfy Rext×R3=R1×R2. Therefore, it is unnecessary to make a size of the external resistor element Rext equal to sizes of the respective resistors in the replica resistor circuit 12. Currents I1, I2 flowing in the reference voltage generating circuit 10 and the comparison voltage generating circuit 13 can be restricted by the resistors R1 and R2. Therefore, current consumption can be reduced by increasing the resistances of the resistors R1 and R2.

Figure 12:
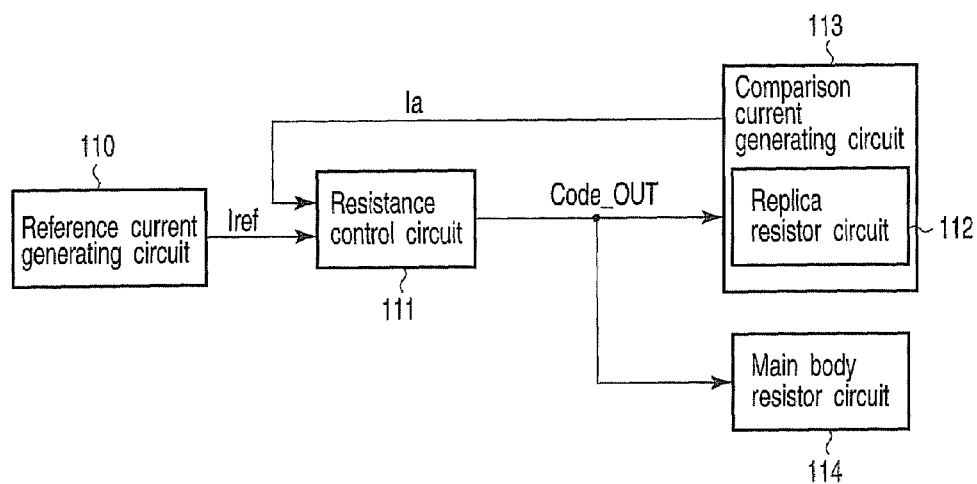
FIG. 12 is a block diagram showing a second basic configuration of resistance adjusting circuits according to embodiments of the present invention.

FIG. 12 is a block diagram showing a second basic configuration of resistance adjusting circuits according to embodiments of the present invention. The resistance adjusting circuit shown in FIG. 12 comprises a reference current generating circuit 110, a resistance control circuit 111, a comparison current generating circuit 113 including a replica resistor circuit 112, and a main body resistor circuit 114 whose resistance is a target to be adjusted. The reference current generating circuit 110 generates a reference current Iref. The replica resistor circuit 112 and the main body resistor circuit 114 have substantially the same configuration, and each resistance thereof is adjusted by a control code signal Code_OUT outputted from the resistance control circuit 111. The comparison current generating circuit 113 generates a comparison current Ia with a value corresponding to a resistance of the replica resistor circuit 112. The resistance control circuit 111 conducts adjustment such that the resistance of the replica resistor circuit 112 is set within a prescribed range based upon the reference current Iref and the comparison current Ia, with the result that adjustment is performed such that the resistance of the main body resistor circuit 114 is set within a prescribed range.

Fourth Embodiment

Figure 13:
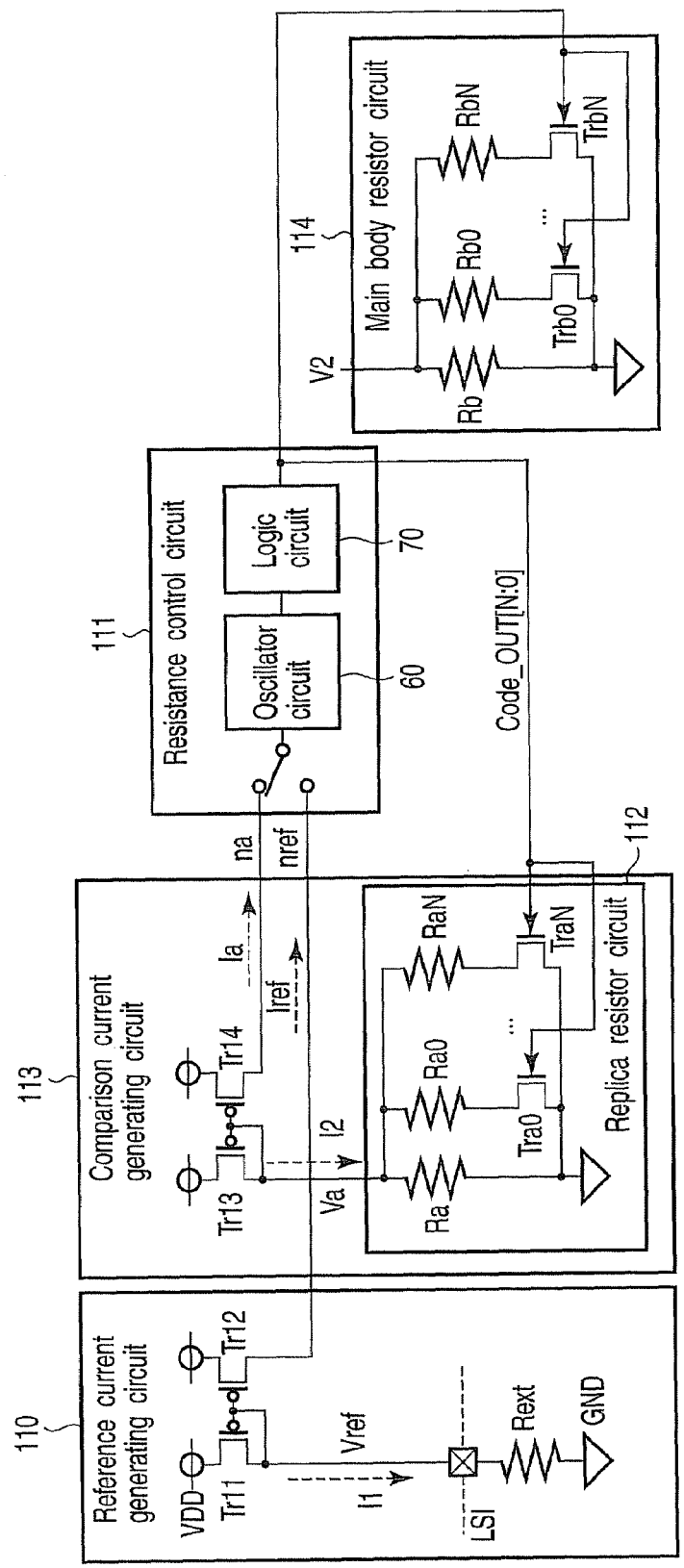
FIG. 13 is a circuit diagram of a resistance adjusting circuit according to a fourth embodiment of the present invention, in which the circuits shown in FIG. 12 are shown in detail.

FIG. 13 is a circuit diagram of a resistance adjusting circuit according to a fourth embodiment of the present invention, in which the circuits shown in FIG. 12 are shown in detail. The reference current generating circuit 110 comprises an external resistor element Rext which is a reference resistor and a current mirror circuit including two P-channel MOS transistors Tr11 and Tr12. One end of the external resistor element Rext is connected to an external terminal of an LSI in which the resistance adjusting circuit is formed, while the other end thereof is connected to a node of a ground voltage (GND). A source-drain path of the MOS transistor Tr11 is connected between a node of a power source voltage (VDD) and the one end of the external resistor element Rext, i.e., the external terminal of the LSI, and a gate electrode thereof is connected to the drain of the MOS transistor Tr11. A source-drain path of the MOS transistor Tr12 is connected between the node of the power source voltage and an output node of the reference current Iref, and a gate electrode thereof is connected to the gate electrode of the MOS transistor Tr11.

In the reference current generating circuit 110, a current I1 corresponding to a resistance of the external resistor element Rext flows in the drain of the MOS transistor Tr11, and the current I1 is mirrored in the current mirror circuit so that the reference current Iref is generated.

The comparison current generating circuit 113 comprises a replica resistor circuit 112 and a current mirror circuit comprising two P-channel MOS transistors Tr13 and Tr14. A source-drain path of the MOS transistor Tr13 is connected between the node of the power source voltage (VDD) and one end of the replica resistor circuit 12, while a gate electrode thereof is connected to the drain. A source-drain path of the MOS transistor Tr14 is connected between the node of the power source voltage and an output node of the comparison current Ia, and a gate electrode thereof is connected to the gate electrode of the MOS transistor Tr13. The other end of the replica resistor circuit 112 is connected to the node of the ground voltage.

In the comparison current generating circuit 113, a current I2 corresponding to the resistance of the replica resistor circuit 112 flows in the drain of the MOS transistor Tr13 and the current I2 is mirrored by the current mirror circuit so that the comparison current Ia is generated.

The resistance control circuit 111 comprises an oscillator circuit 60 and a logic circuit 70, and it outputs a control code signal Code_OUT[N:0] for adjusting the resistances of the replica resistor circuit 112 and the main body resistor circuit 114 based upon the reference current Iref and the comparison current Ia.

The specific configurations of the replica resistor circuit 112 and the main body resistor circuit 114 are similar to those in the second embodiment shown in FIG. 5, and explanation thereof is omitted.

Figure 14:
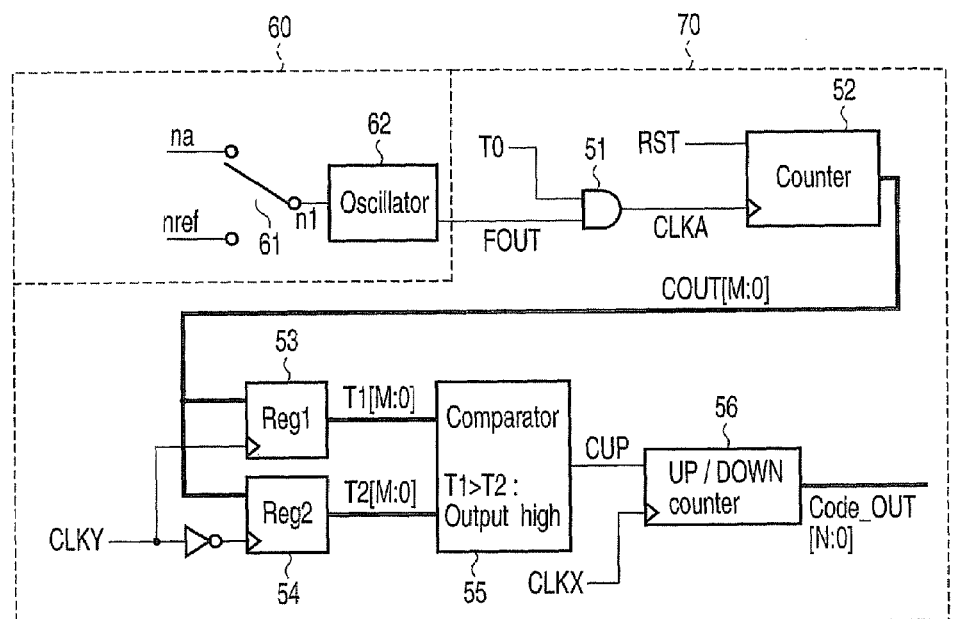
FIG. 14 is a circuit diagram showing one example of a specific configuration of an oscillator circuit and a logic circuit configuring a resistance control circuit of the resistance adjusting circuit according to the fourth embodiment of the present invention.

FIG. 14 shows one example of a specific circuit configuration of the oscillator circuit 60 and the logic circuit 70 configuring the resistance control circuit 111 in FIG. 13. The oscillator circuit 60 comprises a switch 61 and a current-controlled oscillator 62. The switch 61 selects either one of the reference current Iref and the comparison current Ia to supply the selected one to an input node n1 of the current-controlled oscillator 62. The current-controlled oscillator 62 generates an oscillation output with a frequency proportional to an input current. The oscillation output signal of the current-controlled oscillator 62 is supplied to the logic circuit 70.

The logic circuit 70 detects a difference between an oscillation frequency of the current-controlled oscillator 62 during supplying of the reference current Iref to the oscillator 62 and an oscillation frequency of the current-controlled oscillator 62 during supplying of the comparison current Ia to the oscillator 62, and outputs a control code signal Code_OUT[N:0] based upon the detection result. A specific circuit configuration of the logic circuit 70 is similar to that of the logic circuit 50 in the second embodiment shown in FIG. 6, where corresponding portions are attached with the same reference numerals as attached in FIG. 6 and explanation thereof is omitted.

That is, the resistance control circuit 111 comprises the current-controlled oscillator 62 which generates an oscillation output with a frequency proportional to a value of an input value inputted according to switching between the reference current Iref and the comparison current Ia conducted by the switch 61, the counter 52 which counts oscillation output of the current-controlled oscillator 62 during input of the reference current Iref to the oscillator 62 and oscillation output of the current-controlled oscillator 62 during input of the comparison current Ia to the oscillator 62 for the same period of time (T0) to obtain the first and the second count data (T1, t2), the comparator 55 which compares the first and the second count data to each other to determine which is larger or smaller than the other, and the up/down counter 56 which serves as a control signal setting circuit setting a control signal based upon the comparison result of the comparator.

Figure 15:
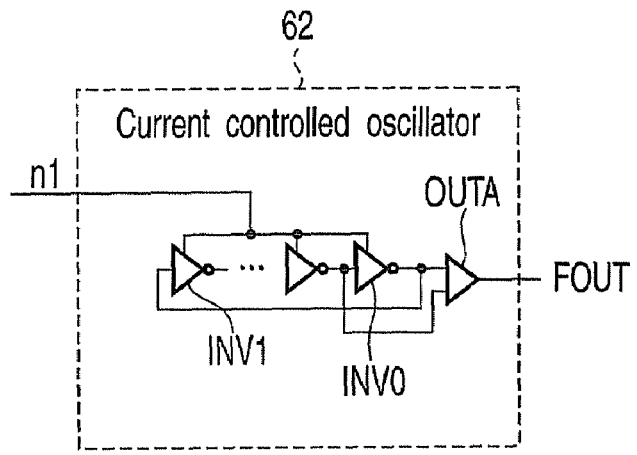
FIG. 15 is a circuit diagram showing one example of a specific configuration of a current-controlled oscillator constituting the oscillator circuit shown in FIG. 14.

FIG. 15 shows one example of a specific circuit configuration of the current-controlled oscillator 62 shown in FIG. 14. The current-controlled oscillator 62 may be a well-known one, and comprises a plurality of inverters INV1 to INV0 which are connected in series such that an output signal from a final stage is fed back as an input signal to a forefront stage and whose power source nodes are supplied with one of the comparison current Ia and the reference current Iref selected by the switch 61, and a differential amplifying circuit OUTA which is supplied with an input signal and an output signal of one of the plurality of inverters INV1 to INV0, the inverter INV0 of the final stage in this example, to generate an oscillation output signal FOUT.

The current-controlled oscillator 62 with such a configuration generates an oscillation output signal FOUT with a frequency proportional to a current value of the comparison current Ia or the reference current Iref which is an input current.

Since the resistance adjusting circuit with such a configuration has such a configuration that the voltage-controlled oscillator 42 of the resistance control circuit is changed to the current-controlled oscillator 62 according to the change of the reference voltage Vref and the comparison voltage Va in the second embodiment shown in FIG. 5 to the reference current Iref and the comparison current Ia, the operation thereof can be estimated from the operation of the second embodiment and explanation thereof is omitted.

In this embodiment, an effect similar to that in the second embodiment can be obtained. In addition, since a current is supplied as input to the oscillator circuit in this embodiment, it is possible to use a control oscillator of a current input type, namely, a current-controlled oscillator.

(Application Example)

Figure 16:
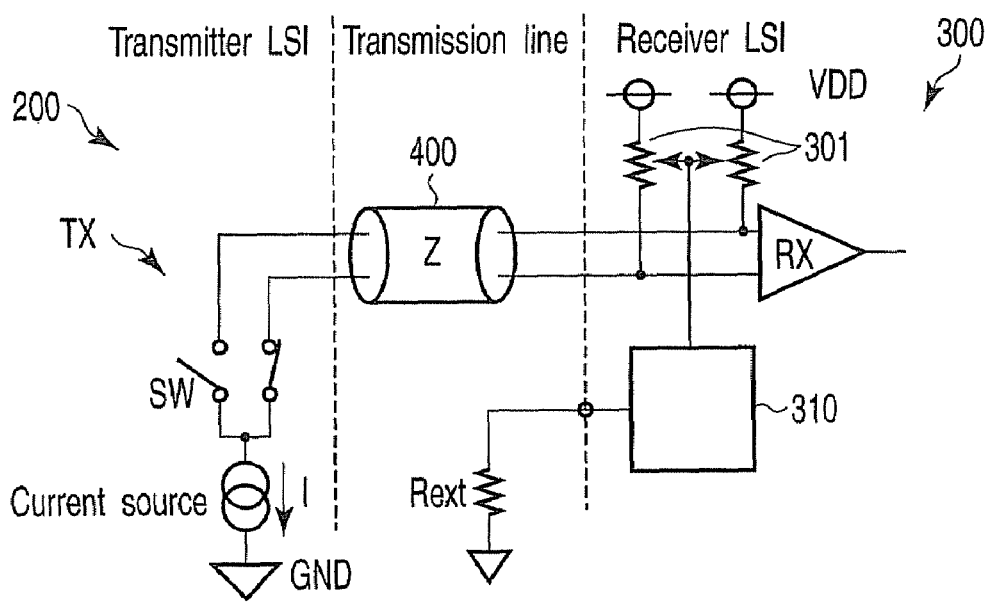
FIG. 16 is a circuit diagram showing a configuration of a high-speed signal communication system according to an application of the present invention.

FIG. 16 shows a configuration of a high-speed signal communication system according to an application example of the present invention. The high-speed signal communication system comprises a semiconductor integrated circuit for transmission (transmitter LSI) 200, a semiconductor integrated circuit for reception (receiver LSI) 300, and a differential transmission line 400 connecting the transmitter LSI 200 to the receiver LSI 300 and having characteristic impedance Z.

A transmission circuit TX is provided within the transmitter LSI 200, and a pair of switches SW which causes a signal current to flow in the differential transmission line 400 is further provided within the transmission line TX.

A receiver circuit RX is provided within the receiver LSI 300. A differential input terminal of the receiver circuit RX is connected to the differential transmission line 400, where a signal transmitted on the differential transmission line is supplied to the receiver circuit RX. A terminal end resistor circuit 301 is connected between the differential input terminal of the receiver circuit RX and a node of the power source voltage (VDD). Reflection of power or the like due to mismatching of impedance can be prevented by adjusting the resistance of the terminal end resistor circuit 301 such that impedance of the differential transmission line 400 and a reception end of the receiver circuit RX become equal to each other. Accordingly, it is necessary to use one whose resistance can be adjusted as the terminal end resistor circuit 301. Therefore, one of the resistance adjusting circuits according to the first to the fourth embodiments is provided within the receiver LSI 300. The terminal end resistor circuit 301 corresponds to the main body resistor circuit 14 or 114 in the first to the fourth embodiments. In this case, the main body resistor circuits 14 and 114 are provided in a double circuit manner. The resistance of the external resistor element Rext configuring the resistance adjusting circuit is set to have the same value as the characteristic impedance Z of the differential transmission line 400. Incidentally, the circuit 310 shown in FIG. 16 collectively shows the circuits except for the main body resistor circuit and the external resistor element Rext in the resistance adjusting circuit in each of the first to the fourth embodiments.

That is, the receiver LSI 300 in the application example comprises the receiver circuit RX having at least one input terminal connected to the differential transmission line 400, the terminal end resistor circuit 301 which is connected to the at least one input terminal of the receiver circuit RX and whose resistance is adjusted according to a control signal, and a circuit 310. A structure of the circuit 310 is not shown in FIG. 16. With reference to FIG. 5 showing the second embodiment, the circuit 310 comprises the reference voltage generating circuit 10 which has a resistance matching with the characteristic impedance of the differential transmission line and generates a reference voltage Vref with a value corresponding to a resistance of an external resistor element Rext connected to the Receiver LSI, the comparison voltage generating circuit 13 which has the replica resistor circuit 12 which is configured in the same manner as the terminal end resistor circuit 301 and whose resistance is adjusted according to the control signal, and which generates a comparison voltage Va with a value corresponding to the resistance of the replica resistor circuit, and the resistance control circuit 11 which converts the reference voltage Vref and the comparison voltage Va to signals having frequencies corresponding to their voltage values, integrates both signals to produce respective integration data, and generates the control signal based upon a difference between both the integration data. As shown in FIG. 6, the resistance control circuit 11 comprises an oscillator 42 which is inputted with one of the reference voltage Vref and the comparison voltage Va in a switching manner to generate an oscillation output with a frequency proportional to a value of an input voltage to the oscillator 42, a counter 52 which counts oscillation outputs of the oscillator 42 during a period of time of input of the reference voltage Vref to the oscillator 42 and oscillation outputs of the oscillator 42 during a period of time of input of the comparison voltage Va to the oscillator 42 for the same period of time to obtain a first and a second count data T1, T2, a comparator 55 which compares the first count data and the second count data with each other to determine which is larger or smaller than the other, and an up/down counter 56 which serves as a control signal setting circuit for setting a control signal based upon the comparison result of the comparator 55.

Alternatively, with reference to FIG. 13 showing the fourth embodiment, the circuit 310 comprises the reference current generating circuit 110 which has a resistance matching with the characteristic impedance of the differential transmission line and generates a reference current Iref with a value corresponding to a resistance of an external resistor element Rext connected to the receiver LSI, the comparison current generating circuit 113 which has the replica resistor circuit 112 which is configured in the same manner as the terminal end resistor circuit 301 and whose resistance is adjusted according to a control signal, and which generates a comparison current Ia with a value corresponding to the resistance of the replica resistor circuit, and the resistance control circuit 111 which converts the reference current Iref and the comparison current Ia to signals having frequencies corresponding to current values thereof, integrates both signals to produce respective integration data, and generates the control signal based upon a difference between both the integration data. As shown in FIG. 14, the resistance control circuit 111 comprises an oscillator 62 which is inputted with one of the reference current Iref and the comparison current Ia in a switching manner to generate an oscillation output with a frequency proportional to a value of an input current to the oscillator 62, a counter 52 which counts oscillation outputs of the oscillator 62 during a period of time of input of the reference current Iref to the oscillator 62 and oscillation outputs of the oscillator 62 during a period of time of input of the comparison current Ia to the oscillator 62 for the same period of time to obtain a first and a second count data T1, T2, a comparator 55 which compares the first count data and the second count data with each other to determine which is larger or smaller than the other, and an up/down counter 56 which serves as a control signal setting circuit for setting a control signal based upon the comparison result of the comparator 55.

In the high-speed signal communication system with such a configuration, the resistance of the terminal end resistor circuit 301 can be adjusted with a high accuracy in the receiver LSI 300 for the same reason as explained in the resistance adjusting circuits according to the first to fourth embodiments. In addition, circuit design of the resistance adjusting circuit can easily be performed.

Incidentally, the present invention is not limited to the respective embodiments described above but it can be modified variously. For example, the resistance control circuit 11 or 111 in the first to fourth embodiments is not always configured as illustrated. In fact, any resistance circuit configured to convert a reference voltage and a comparison voltage or a reference current and a comparison current to signals having frequencies corresponding to the respective voltage values or current values, integrate both the signals to generate integration data of the both signals, and generate a control signal based upon a difference between both the integration data can be adopted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A resistance adjusting circuit including a semiconductor integrated circuit comprising:
    a reference voltage generating circuit which generates a reference voltage having a value corresponding to a resistance of an external resistor element connected to the semiconductor integrated circuit;
    a comparison voltage generating circuit which comprises a replica resistor circuit whose resistance is adjusted according to a resistance control signal and generates a comparison voltage having a value corresponding to a resistance of the replica resistor circuit;
    a main body resistor circuit which has substantially the same configuration as that of the replica resistor circuit and whose resistance is adjusted according to the resistance control signal, and
    a control signal generating circuit which receives the reference voltage and the comparison voltage and converts the reference voltage and the comparison voltage to frequency signals having frequencies corresponding to values of the reference voltage and the comparison voltage, integrates the frequency signals of the reference voltage and the comparison voltage to produce integration data of the frequency signals, and generates the resistance control signal based upon a difference between the integration data.

2. The resistance adjusting circuit according to claim 1, wherein the control circuit comprises:
    an oscillator circuit which is inputted with the reference voltage and the comparison voltage in a switching manner and generates oscillation outputs having the frequencies corresponding to the values of the reference voltage and the comparison voltage,
    a counter circuit which counts the oscillation output of the oscillator circuit during input of the reference voltage to the oscillator circuit and the oscillation output of the oscillator circuit during input of the comparison voltage to the oscillator circuit, for the same period of time, respectively, to provide a first count data and a second count data, respectively,
    a comparison circuit which compares the first count data and the second count data to determine which is larger or smaller to provide a comparison result, and
    a control signal setting circuit which sets the resistance control signal based upon the comparison result of the comparison circuit.

3. The resistance adjusting circuit according to claim 1, wherein the reference voltage generating circuit comprises a first MOS transistor having a source-drain path connected between a power source voltage node and an end of the external resistor element and a gate applied with a predetermined bias voltage, the reference voltage being taken out from a node of the source-drain path of the first MOS transistor and the end of the external resistor element, and the comparison voltage generating circuit comprises a second MOS transistor having a source-drain path connected between the power source voltage node and an end of the replica resistor circuit at a side of the power source voltage node thereof and a gate applied with the predetermined bias voltage, and the comparison voltage being taken out from a node of the source-drain path of the second MOS transistor and the end of the replica resistor circuit at the side of the power source voltage node thereof.

4. The resistance adjusting circuit according to claim 1, wherein the reference voltage and the comparison voltage are converted to the frequency signals by a voltage-controlled oscillator.

5. The resistance adjusting circuit according to claim 1, wherein the reference voltage generating circuit comprises a first resistor element connected between a power source voltage node and an end of the external resistor element, the reference voltage being taken out from a node of the first resistor element and the end of the external resistor element, and the comparison voltage generating circuit comprises a second resistor element connected between the power source voltage node and an end of the replica resistor circuit at a side of the power source voltage node thereof, and the comparison voltage being taken out from a node of the second resistor element and the end of the replica resistor circuit at the side of the power source voltage node thereof.

6. The resistance adjusting circuit according to claim 5, wherein the external resistor element, the first resistor element, the second resistor element, and a resistor element of the replica resistor circuit constitute a bridge circuit.

7. A resistance adjusting circuit including a semiconductor integrated circuit comprising:
    a reference current generating circuit which generates a reference current having a value corresponding to a resistance of an external resistor element connected to the semiconductor integrated circuit;
    a comparison current generating circuit which comprises a replica resistor circuit whose resistance is adjusted according to a resistance control signal and generates a comparison current having a value corresponding to a resistance of the replica resistor circuit;
    a main body resistor circuit which has substantially the same configuration as that of the replica resistor circuit and whose resistance is adjusted according to the resistance control signal, and
    a control signal generating circuit which receives the reference current and the comparison current and converts the reference current and the comparison current to frequency signals having frequencies corresponding to values of the reference current and the comparison current, integrates the frequency signals of the reference current and the comparison current to produce integration data of the frequency signals, and generates the resistance control signal based upon a difference between the integration data.

8. The resistance adjusting circuit according to claim 7, wherein the control circuit comprises:
    an oscillator circuit which is inputted with the reference current and the comparison current in a switching manner and generates oscillation outputs having the frequencies corresponding to the values of the reference current and the comparison current,
    a counter circuit which counts the oscillation output of the oscillator circuit during input of the reference current to the oscillator circuit and the oscillation output of the oscillator circuit during input of the comparison current to the oscillator circuit, for the same period of time, respectively, to provide a first count data and a second count data, respectively, a comparison circuit which compares the first count data and the second count data to determine which is larger or smaller to provide a comparison result, and a control signal setting circuit which sets the resistance control signal based upon the comparison result of the comparison circuit.

9. The resistance adjusting circuit according to claim 7, wherein the reference current generating circuit comprises a first MOS transistor having a source-drain path connected between a power source current node and an end of the external resistor element and a gate connected to the end of the external resistor element and a second MOS transistor having a source-drain path connected between the power source current node and an output terminal of the reference current and a gate connected to the end of the external resistor element, and the comparison current generating circuit comprises a third MOS transistor having a source-drain path connected between the power source current node and an end of the replica resistor circuit at a side of the power source current node thereof and a gate connected to the end of the replica resistor circuit at the side of the power source current node thereof and a fourth MOS transistor having a source-drain path connected between the power source current node and an output terminal of the reference current and a gate connected to the end of the replica resistor circuit at the side of the power source current node thereof.

10. The resistance adjusting circuit according to claim 7, wherein the reference current and the comparison current are converted to the frequency signals by a current-controlled oscillator.

11. A semiconductor integrated circuit comprising:
a signal receiving circuit which has at least one input terminal connected to a transmission line;
a terminal end resistor circuit which is connected to the at least one input terminal of the signal receiving circuit and whose resistance is adjusted according to a control signal;
a reference electricity generating circuit which generates a reference electricity having a value corresponding to a resistance of an external resistor element connected to the semiconductor integrated circuit, the resistance of the external resistor element matching with a characteristic impedance of the transmission line;
a comparison electricity generating circuit which is provided with a replica resistor circuit which has substantially the same configuration as that of the terminal end resistor circuit and whose resistance is adjusted according to the control signal, and which generates a comparison electricity having a value corresponding to the resistance of the replica resistor circuit; and
a control signal generating circuit which receives the reference electricity and the comparison electricity and converts the reference electricity and the comparison electricity to frequency signals having frequencies corresponding to values of the reference electricity and the comparison electricity, integrates the frequency signals of the reference electricity and the comparison electricity to produce integration data of the frequency signals, and generates the resistance control signal based upon a difference between the integration data.

12. The semiconductor integrated circuit according to claim 11, wherein the reference electricity is a reference voltage, the reference electricity generating circuit is a reference voltage generating circuit, the comparison electricity is a comparison voltage, and the comparison electricity generating circuit is a comparison voltage generating circuit.

13. The semiconductor integrated circuit according to claim 12, wherein the control circuit comprises:
an oscillator circuit which is inputted with the reference voltage and the comparison voltage in a switching manner and generates oscillation outputs having the frequencies corresponding to the values of the reference voltage and the comparison voltage,
a counter circuit which counts the oscillation output of the oscillator circuit during input of the reference voltage to the oscillator circuit and the oscillation output of the oscillator circuit during input of the comparison voltage to the oscillator circuit, for the same period of time, respectively, to provide a first count data and a second count data, respectively,
a comparison circuit which compares the first count data and the second count data to determine which is larger or smaller to provide a comparison result, and
a control signal setting circuit which sets the resistance control signal based upon the comparison result of the comparison circuit.

14. The semiconductor integrated circuit according to claim 12, wherein the reference voltage generating circuit comprises a first MOS transistor having a source-drain path connected between a power source voltage node and an end of the external resistor element and a gate applied with a predetermined bias voltage, the reference voltage being taken out from a node of the source-drain path of the first MOS transistor and the end of the external resistor element, and the comparison voltage generating circuit comprises a second MOS transistor having a source-drain path connected between the power source voltage node and an end of the replica resistor circuit at a side of the power source voltage node thereof and a gate applied with the predetermined bias voltage, and the comparison voltage being taken out from a node of the source-drain path of the second MOS transistor and the end of the replica resistor circuit at the side of the power source voltage node thereof.

15. The semiconductor integrated circuit according to claim 12, wherein the reference voltage generating circuit comprises a first resistor element connected between a power source voltage node and an end of the external resistor element, the reference voltage being taken out from a node of the first resistor element and the end of the external resistor element, and the comparison voltage generating circuit comprises a second resistor element connected between the power source voltage node and an end of the replica resistor circuit at a side of the power source voltage node thereof, and the comparison voltage being taken out from a node of the second resistor element and the end of the replica resistor circuit at the side of the power source voltage node thereof.

16. The semiconductor integrated circuit according to claim 12, wherein the reference voltage and the comparison voltage are converted to the frequency signals by a voltage-controlled oscillator.

17. The semiconductor integrated circuit according to claim 11, wherein the reference electricity is a reference current, the reference electricity generating circuit is a reference current generating circuit, the comparison electricity is a comparison current, and the comparison electricity generating circuit is a comparison current generating circuit.

18. The semiconductor integrated circuit according to claim 17, wherein the control circuit comprises:
an oscillator circuit which is inputted with the reference current and the comparison current in a switching manner and generates oscillation outputs having the frequencies corresponding to the values of the reference current and the comparison current, a counter circuit which counts the oscillation output of the oscillator circuit during input of the reference current to the oscillator circuit and the oscillation output of the oscillator circuit during input of the comparison current to the oscillator circuit, for the same period of time, respectively, to provide a first count data and a second count data, respectively, a comparison circuit which compares the first count data and the second count data to determine which is larger or smaller to provide a comparison result, and a control signal setting circuit which sets the resistance control signal based upon the comparison result of the comparison circuit.

19. The semiconductor integrated circuit according to claim 17, wherein the reference current generating circuit comprises a first MOS transistor having a source-drain path connected between a power source current node and an end of the external resistor element and a gate connected to the end of the external resistor element and a second MOS transistor having a source-drain path connected between the power source current node and an output terminal of the reference current and a gate connected to the end of the external resistor element, and the comparison current generating circuit comprises a third MOS transistor having a source-drain path connected between the power source current node and an end of the replica resistor circuit at a side of the power source current node thereof and a gate connected to the end of the replica resistor circuit at the side of the power source current node thereof and a fourth MOS transistor having a source-drain path connected between the power source current node and an output terminal of the reference current and a gate connected to the end of the replica resistor circuit at the side of the power source current node thereof.

20. The semiconductor integrated circuit according to claim 17, wherein the reference current and the comparison current are converted to the frequency signals by a current-controlled oscillator.

* * * * *